(12) United States Patent
Kawano et al.

(10) Patent No.: US 6,617,620 B1
(45) Date of Patent: Sep. 9, 2003

(54) GATE ARRAY WITH BORDER ELEMENT

(75) Inventors: Harumi Kawano, Miyazaki (JP);
Katsuyoshi Takahashi, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/406,850

(22) Filed: Sep. 29, 1999

(51) Int. Cl.[7] .............................................. H01L 27/10
(52) U.S. Cl. ...................... 257/207; 257/202; 257/203
(58) Field of Search ........................ 257/206–211, 203, 257/202

(56) References Cited

U.S. PATENT DOCUMENTS

| | | | |
|---|---|---|---|
| 4,511,914 A | | 4/1985 | Remedi et al. |
| 5,307,309 A | * | 4/1994 | Protigal et al. ................ 365/63 |
| 5,401,989 A | * | 3/1995 | Kikuchi ....................... 257/211 |
| 6,121,645 A | * | 9/2000 | Masuda et al. ............. 257/207 |

FOREIGN PATENT DOCUMENTS

| JP | 59-169166 | * | 9/1984 | ........... H01L/27/04 |
|---|---|---|---|---|
| JP | 9-55434 | | 2/1997 | |

* cited by examiner

*Primary Examiner*—Ori Nadav
(74) *Attorney, Agent, or Firm*—Volentine Francos, PLLC

(57) ABSTRACT

A gate array comprises a core cell having a plurality of logic gates, a power supply pattern provided beside the core cell for providing electrical power to the core cell, and a border element provided beside the power supply pattern for providing capacitance or resistance to the core cell. The border element has a capacity cell including a transistor that provides the capacitance to the core cell, a resistor cell including a transistor that provides resistance to the core cell, and a material having resistance to be provided to the core cell.

37 Claims, 19 Drawing Sheets

GATE ARRAY WITH BORDER ELEMENT

BACKGROUND OF THE INVENTION

1. Field of Invention

The present invention relates to a gate array. In particular, the present invention relates to a gate array that can minimize the number of pins of the gate array and the number of components outside the gate array.

2. Description of Related Art

FIG. 1(a) shows a top view of a conventional gate array. FIG. 1(b) shows an enlarged view of portion (B) of FIG. 1(a). The gate array comprises a core cell region 10, a power supply pattern 12, and an input/output cell region 16. The core cell region 10 has a plurality of logic gates. The power supply pattern 12 is provided beside the core cell region 10 for providing electrical power to the core cell region 10. The power supply pattern 12 has two parallel patterns, with the inside portion of the power supply pattern 12 being connected to the ground, and the outside portion of the power supply pattern 12 being connected to the power source $V_{DD}$. The input/output cell region 16 is provided beside the power supply pattern 12. The input/output cell region 16 inputs and outputs data for the core cell region 10.

FIG. 2 shows an A—A cross sectional view of the gate array shown in FIG. 1(b). The core cell region 10, the power supply pattern 12, and the input/output cell region 16 are provided on a substrate 30. The core cell region 10 and the input/output cell region 16 are made by a transistor. The power supply pattern 12 is placed on the insulator 32, which is provided between the power supply pattern 12 and the substrate 30 to insulate the electric current between the two elements.

The region under the power supply pattern 12 is not used efficiently in conventional gate arrays. Here, the region under the power supply pattern 12 refers to the region between the substrate 30 and the insulator 32. To constitute a circuit such as phase-lock loop and an analog circuit within the gate array, a large capacitance and resistance are needed within the gate array. To enlarge the capacitance and resistance of the gate array, the area of the core cell region 10 must be made larger.

However, because the core cell region 10 is not designed to have high capacitance and resistance, but rather to have high operation speed, a large area of the core cell region 10 is used for providing necessary capacitance and resistance. Therefore, it is difficult to install circuits such as phase-lock loop within the gate array, and the number of gate array signal pins and the number of components outside the gate array is increased.

FIG. 3(a) shows a top view of another conventional gate array. FIG. 3(b) shows an enlarged view of the portion (B) in the FIG. 3(a). This gate array also comprises a core cell region 10, a power supply pattern 12, and an input/output cell region 16, but differs from the gate array of FIG. 1 and FIG. 3 in that a portion of the core cell region 10 is provided under the power supply pattern 12.

FIG. 4 shows an A—A cross sectional view of the gate array shown in FIG. 3(b). The core cell region 10a and 10b are provided on the substrate 30. The power supply pattern 12 is provided on the insulator 32, which is itself provided on the core cell region 10b to insulate the electric current between the power supply pattern 12 and the core cell region 10b. In other words, the core cell region 10b is provided between the substrate 30 and the power supply pattern 12.

The gate array of FIG. 3 comprises a larger core cell region 10 than does the gate array of FIG. 1. However, because the core cell region 10 is not designed to have a large capacitance or resistance, the core cell region 10 can not provide sufficient capacitance and resistance to a circuit such as a phase-lock loop that requires significant capacitance and resistance. It is therefore difficult to include a circuit such as phase-lock loop within the gate array, and the number of signal pins of gate array and the number of components outside the gate array will be increased.

Given these problems, it is an object of the present invention to provide a gate array which can minimize the number of pins of the gate array and can reduce the components outside of the gate array.

SUMMARY OF THE INVENTION

As stated, it is an object of the present invention to provide a gate array that is capable of solving the problems described above. The object of the present invention can be achieved by the combinations of features described in the independent claims of the present invention. The dependent claims of the present invention define further advantageous embodiments of the present invention According to the first aspect of the present invention, a gate array comprises a core cell having a plurality of logic gates, a power supply pattern provided beside the core cell for providing electrical power to the core cell, and a border element provided beside the power supply pattern for providing capacitance or resistance to the core cell.

According to another aspect of the present invention, a gate array can be provided such that the border element has a capacity cell including a transistor for providing the capacitance to the core cell. The capacity cell can be provided under the power supply pattern.

According to a still other aspect of the present invention, a gate array can be provided which further comprises an input/output cell region provided beside the power supply pattern to input and output data for the core cell, and in which the capacity cell is provided between the power supply pattern and the input/output cell region.

A portion of the core cell can be provided under the power supply pattern. The border element may have a plurality of the capacity cells, and each of the capacity cells has substantially same capacitance with each other.

The border element may have a plurality of capacity cells, and each of the capacity cells may have a different capacitance. The capacitance of the capacity cell can be larger than capacitance of the core cell. Preferably, the width of the capacity cell is substantially equal to the width of the power supply pattern.

According to yet another aspect of the present invention, a gate array can be provided such that the border element has a resistor cell including a transistor that provides the resistance to the core cell. The resistor cell can be provided under the power supply pattern.

According to a still further aspect of the present invention, a gate array can be provided which further comprises an input/output cell region provided beside the power supply pattern to input and output data for the core cell, and wherein the resistor cell is provided between the power supply pattern and the input/output cell region. A portion of the core cell can be provided under the power supply pattern.

The border element may have a plurality of the resistor cells of substantially equal resistance. The border element may have a plurality of the resistor cells, and each of the resistor cells has different resistance with each other. The resistance of the resistor cell can be larger than resistance of the core cell.

According to yet another aspect of the present invention, a gate array can be provided such that the border element comprises a material that provides resistance to the core cell. The material can be provided under the power supply pattern.

The material can also be provided between the power supply pattern and the input/output cell region. A portion of the core cell can be provided under the power supply pattern. The border element may have a plurality of materials, and each may have substantially the same resistance, or the resistance of the materials may differ.

According to a still further aspect of the present invention, a gate array can be provided such that the border element has a capacity cell including a transistor that provides capacitance to the core cell, a resistor cell having-a transistor that provides resistance to the core cell, and a material having resistance to be provided to the core cell; The capacity cell, the resistor cell, and the resistor can be provided under the power supply pattern.

DETAILED DESCRIPTION OF THE INVENTION

The present invention will be explained using embodiments of the present invention. The following embodiments, however, do not limit the scope of the present invention described in the claims. Moreover, not all the features or their combinations described in the embodiments are necessarily essential for the present invention.

Figure 1:
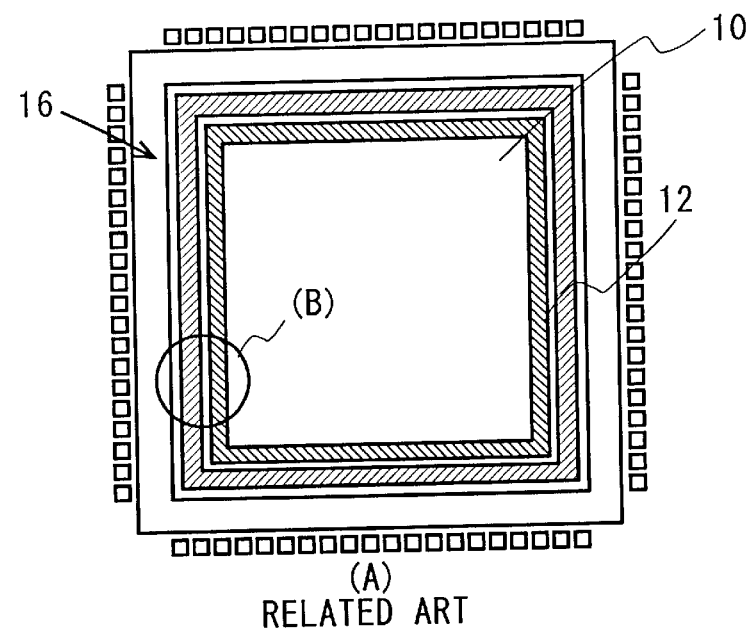
FIG. 1(a) shows a top view of a conventional gate array.
FIG. 1(b) shows an enlarged view of the portion (B) of FIG. 1(a).
Figure 1:
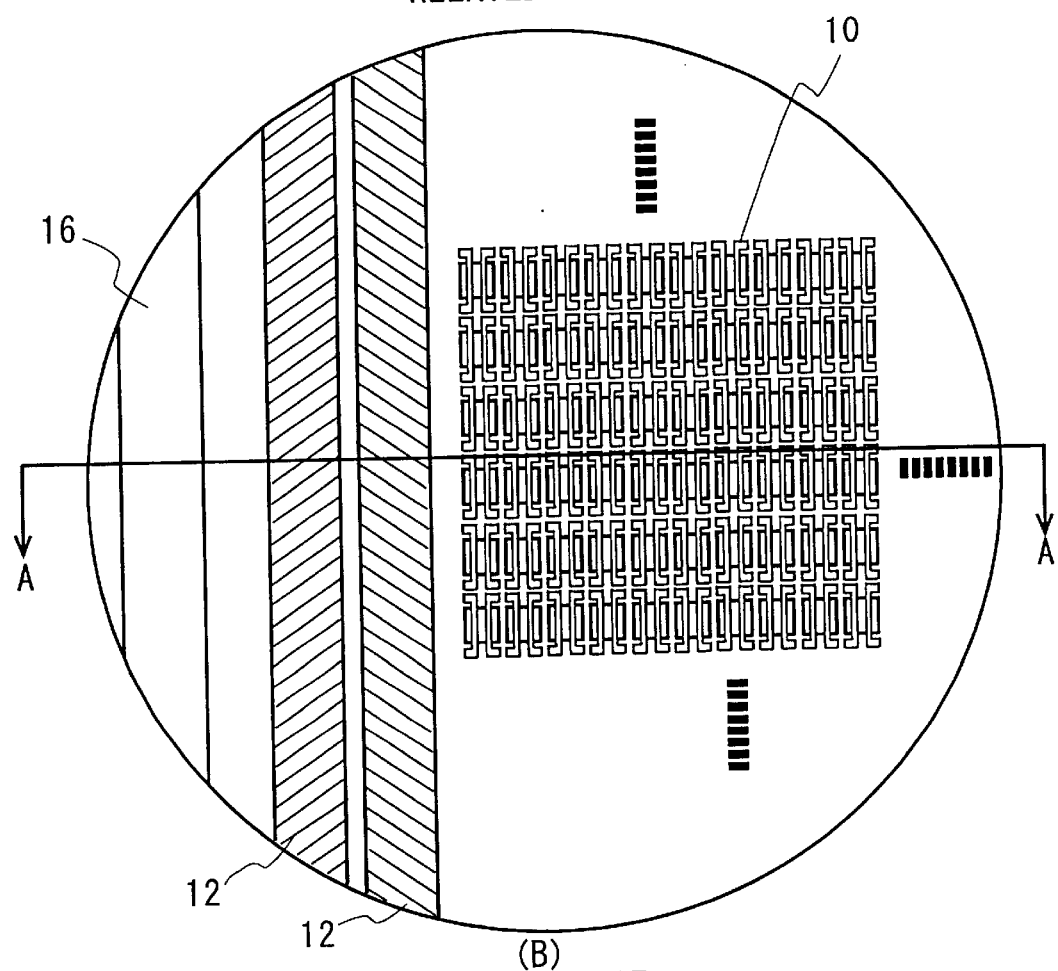
Figure 2:
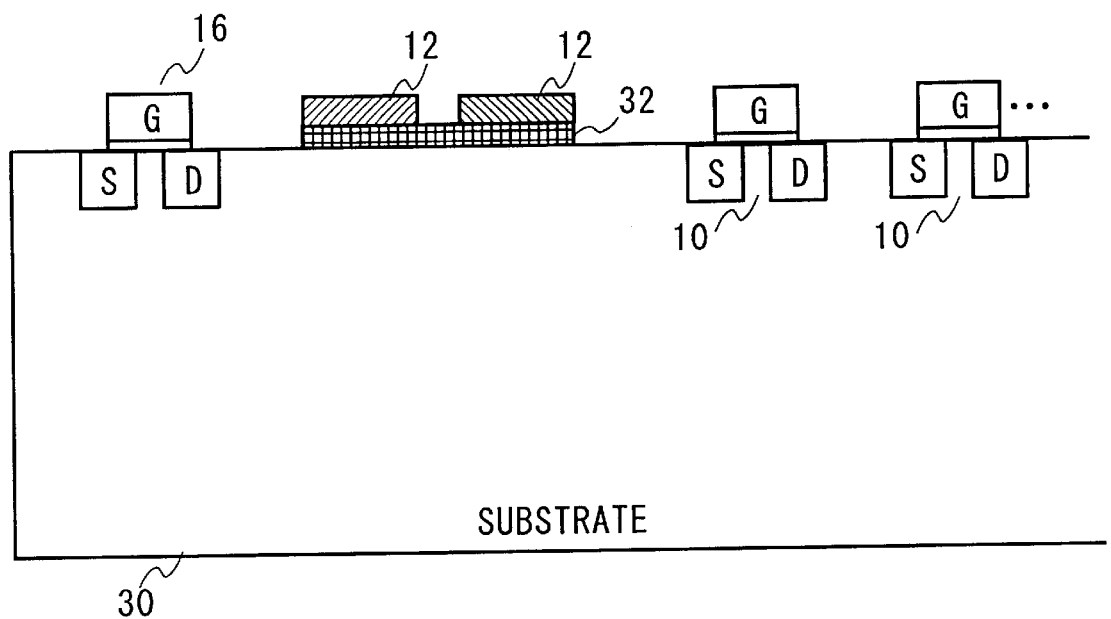
FIG. 2 shows an A—A cross sectional view of the gate array shown in FIG. 1(b).
Figure 3:
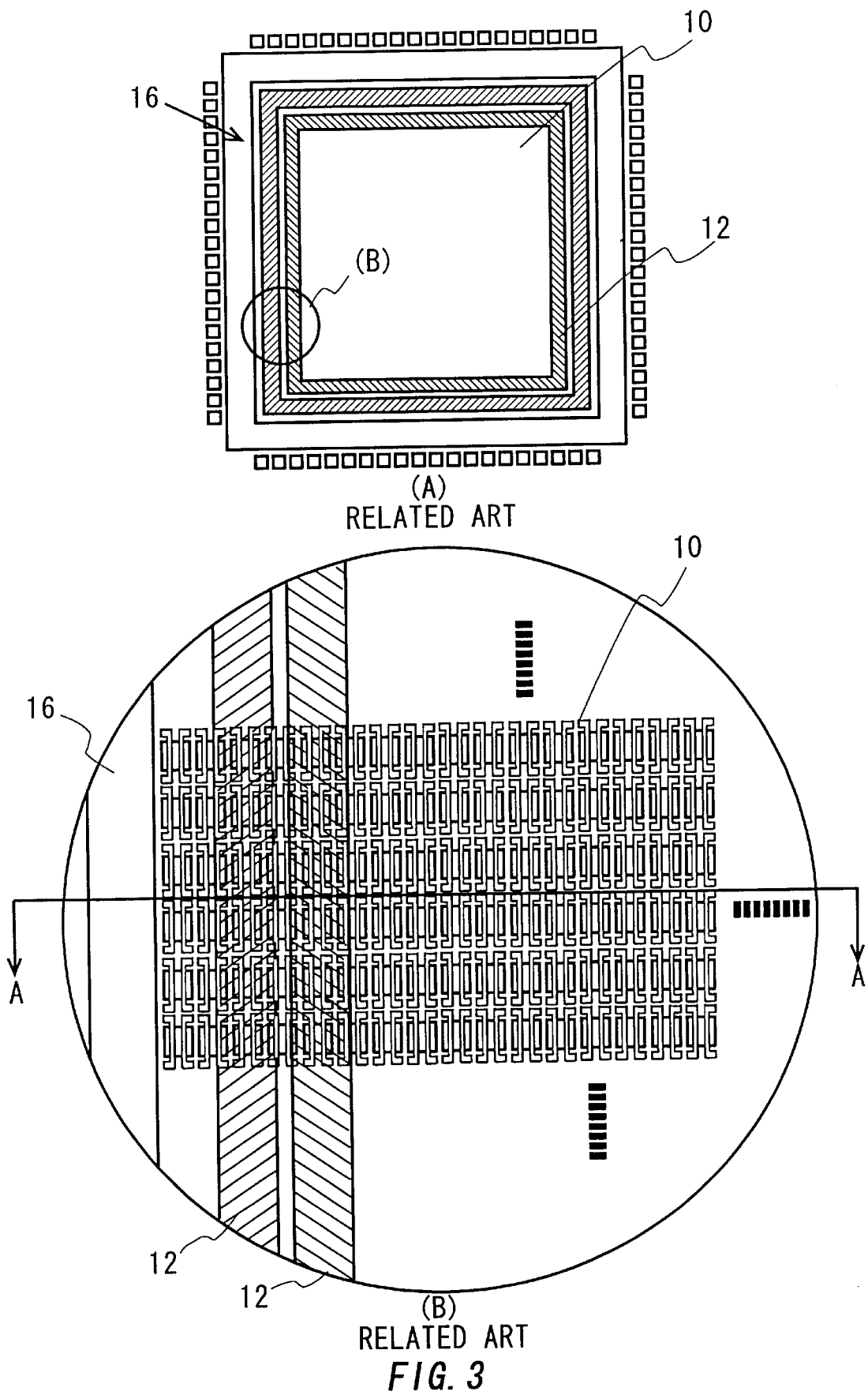
FIG. 3(a) shows a top view of another conventional gate array.
FIG. 3(b) shows an enlarged view of the portion (B) of FIG. 3(a).
Figure 4:
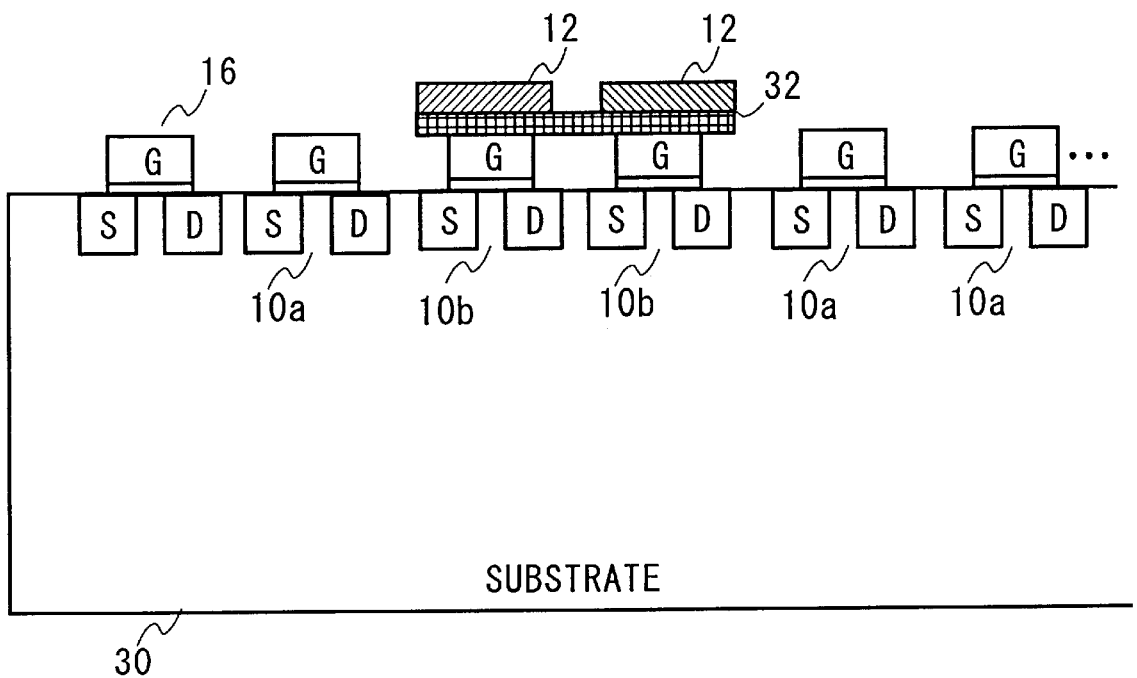
FIG. 4 shows an A—A cross sectional view of the gate array shown in FIG. 3(b).
Figure 5:
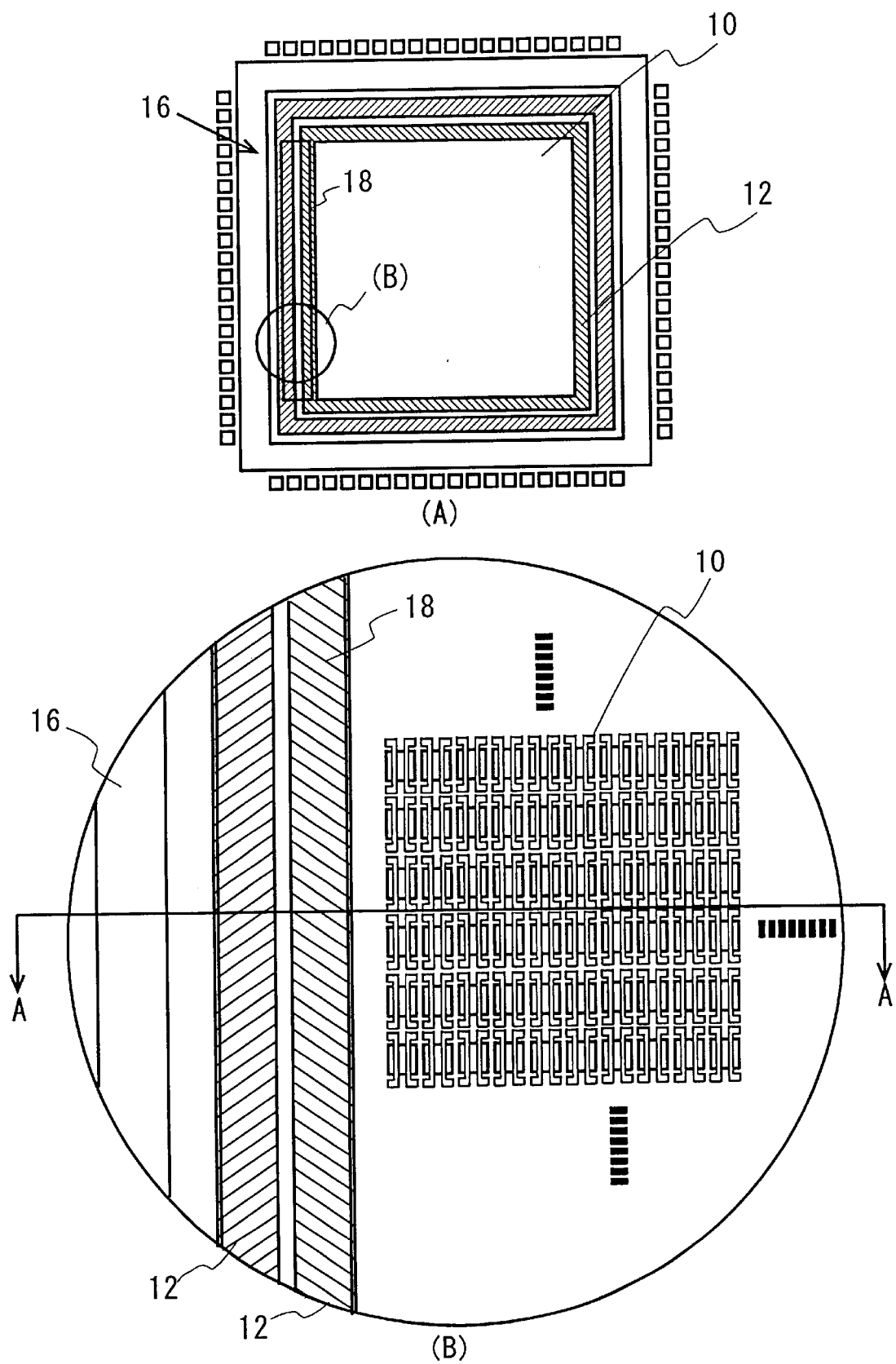
FIG. 5(a) shows a top view of the gate array according to a first embodiment of the present invention.
FIG. 5(b) shows an enlarged view the portion (B) in the FIG. 5(a).

FIG. 5(a) shows a top view of agate array according to the first embodiment of present invention. FIG. 5(b) shows an enlarged view of the portion (B) shown in FIG. 5(a). The same reference numerals are given to those components that are illustrated in FIG. 1. Such components will not be explained again here. The gate array has a core cell region 10, a power supply pattern 12, an input/output cell region 16, and a capacity cell 18. The capacity cell 18 has a transistor that provides capacitance to the core cell region 10. The width of the capacity cell 18 is substantially equal to that of the power supply pattern 12. The capacity cell 18 is provided beside the power supply pattern 12, for example, under the power supply pattern 12.

Figure 6:
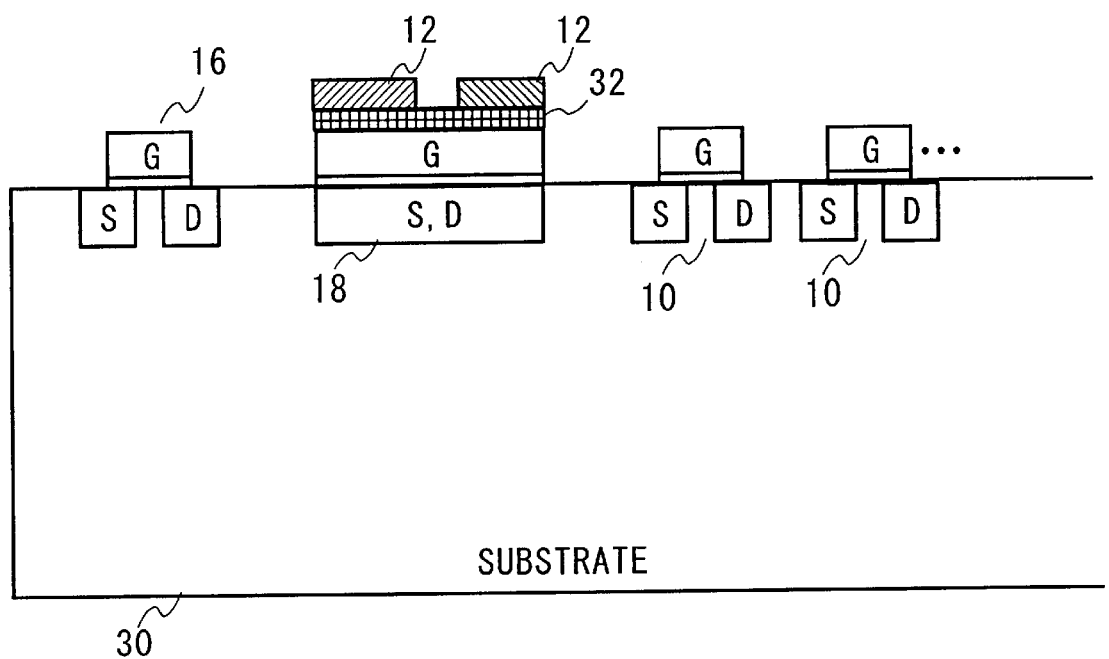
FIG. 6 shows an A—A cross sectional view of the gate array shown in FIG. 5(b).

FIG. 6 shows an A—A cross sectional view of the gate array shown in FIG. 5(b). The capacity cell 18 is provided on the substrate 30. The power supply pattern 12 is provided on the insulator 32, which is provided on the capacity cell 18 to insulate the electric current between the power supply pattern 12 and the capacity cell 18. Therefore, the capacity cell 18 is provided between the substrate 30 and the power supply pattern 12.

To constitute a circuit such as a phase-lock loop within the gate array, a large capacitance is required. Because the area of a transistor of the capacity cell 18 is larger than the area of a transistor of the core cell region 10, the capacitance of the capacity cell 18 can be larger than the capacitance of the core cell region 10.

The capacity cell 18 can be connected to the core cell region 10 for providing a large capacitance to the core cell region 10. A circuit such as phase-lock loop thus can be constructed within of the gate array, and the number of signal pins of the gate array and the number of components outside of the gate array can thereby be reduced.

Figure 7:
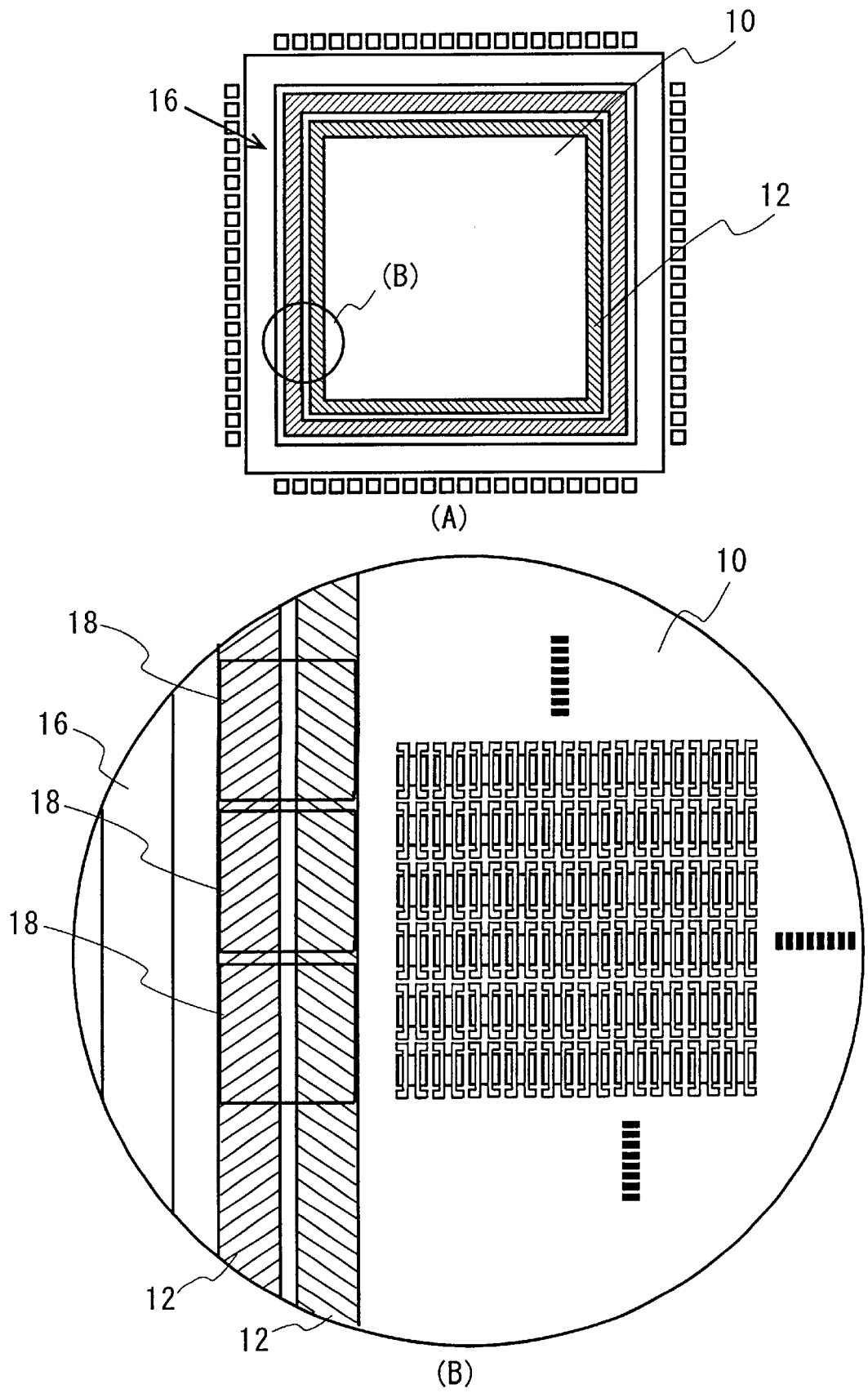
FIG. 7(a) shows a top view of another gate array according to the present invention.
FIG. 7(b) shows an enlarged view of the portion (B) in the FIG. 7(a).

FIG. 7(a) shows a top view of another gate array according to the present invention. FIG. 7(b) shows an enlarged view of the portion (B) in the FIG. 7(a). The gate array also has a core cell region 10, a power supply pattern 12, an input/output cell region 16, and a plurality of capacity cells 18. The capacity cells 18 are provided besides one of the power supply pattern 12, for example, between the substrate 30 and the power supply pattern 12. The capacity cell 18 has substantially the same width as that of the power supply pattern 12. The plurality of capacity cells 18 has substantially equal capacitance. Because there are plurality of capacity cells 18, the desired capacitance can be easily provided to core cell region 10 by connecting the desired capacity cells 18 to the core cell region 10.

Figure 8:
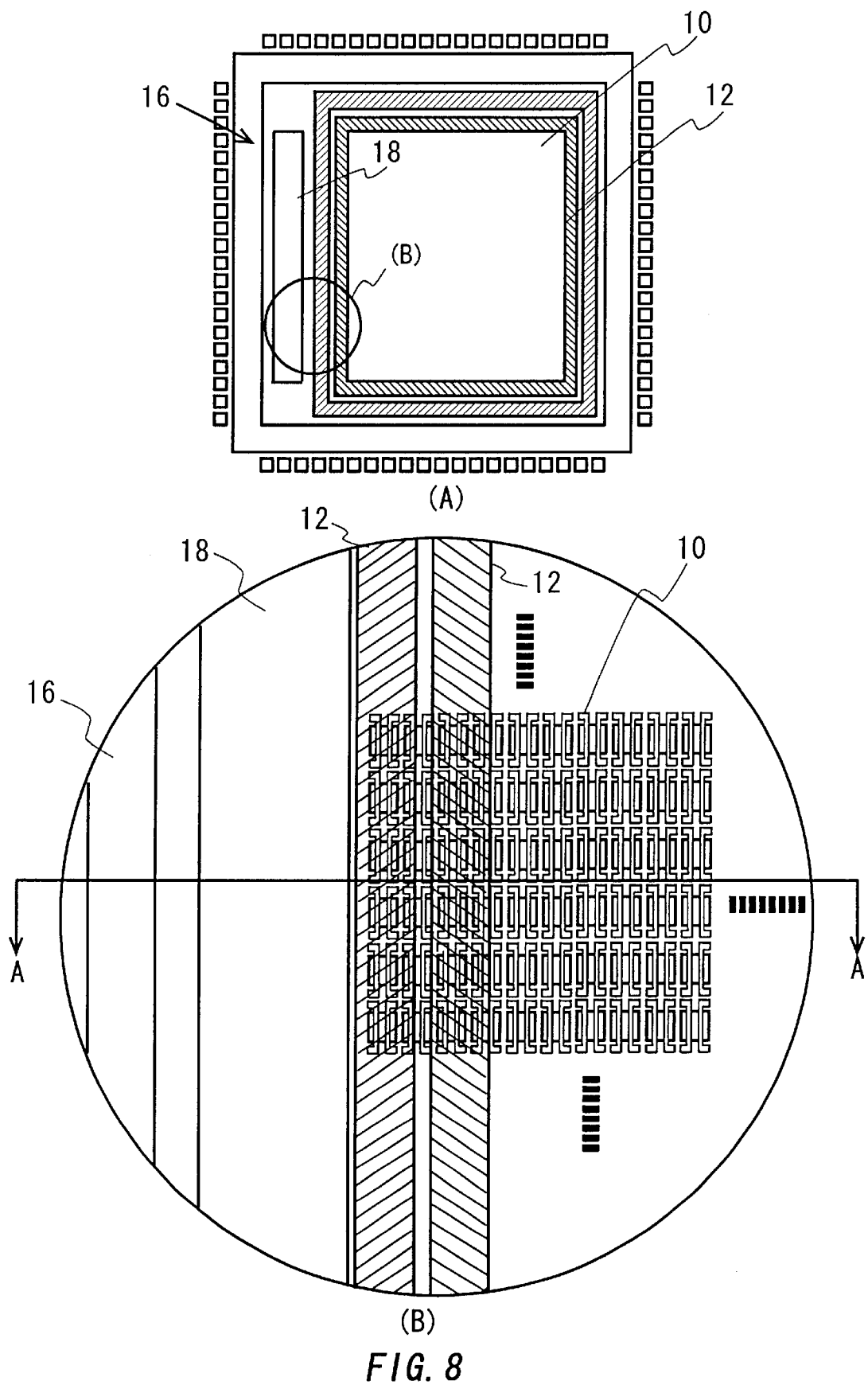
FIG. 8(a) shows a top view of another gate array according to the present invention and FIG. 8(b) shows an enlarged view of the portion (B) in the FIG. 8(a).

FIG. 8(a) shows a top view of another gate array according to the present invention. FIG. 8(b) shows an enlarged view of the portion (B) in the FIG. 8(a). The gate array has a core cell region 10, a power supply pattern 12, an input/output cell region 16, and a capacity cell 18. The capacity cell 18 is provided between the input/output cell region 16 and the power supply pattern 12. One of the four sides of the power supply pattern 12 is provided above the core cell region 10. The capacity cell 18 is provided between power supply pattern 12 and the input/output cell region 16. The left side of the core cell region 10 is provided under the power supply pattern 12.

Figure 9:
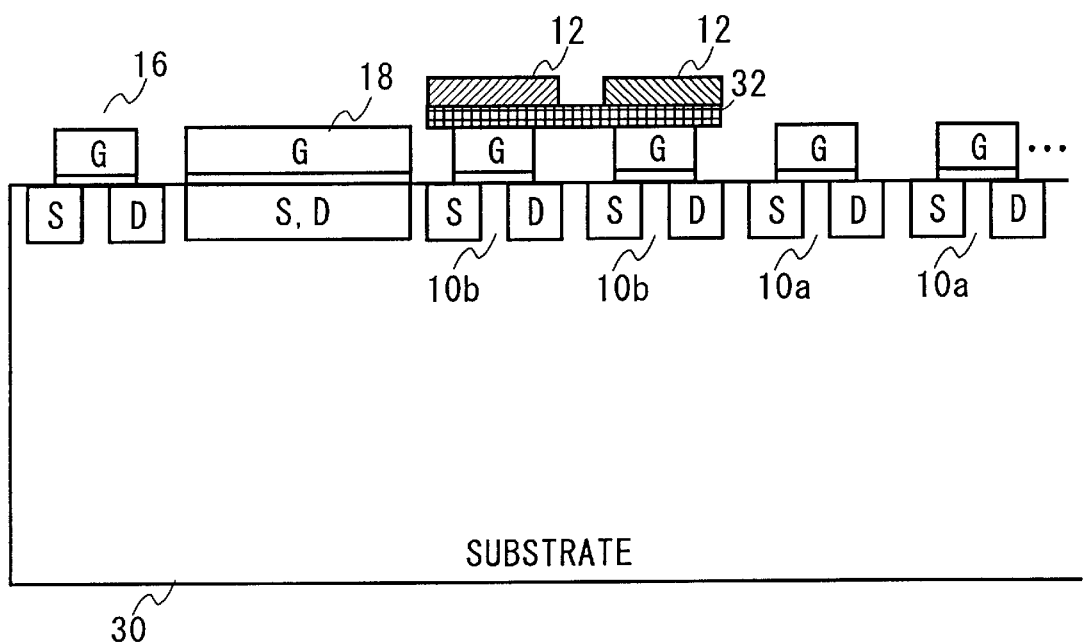
FIG. 9 shows an A—A cross sectional view of the gate array shown in FIG. 8(b).

FIG. 9 shows an A—A cross sectional view of the gate array shown in FIG. 8(b). The core cell region 10a and 10b are provided on the substrate 30. The power supply pattern 12 is provided on the insulator 32, which is provided on the core cell region 10b to insulate the electric current between the power supply pattern 12 and the core cell region 10b. Therefore, the core cell region 10b is provided between the substrate 30 and the power supply pattern 12. Because the power supply pattern 12 is provided over the core cell region 10b, the influence of the change of the electrical potential of the power supply pattern 12 on the capacity cell 18 is reduced.

Figure 10:
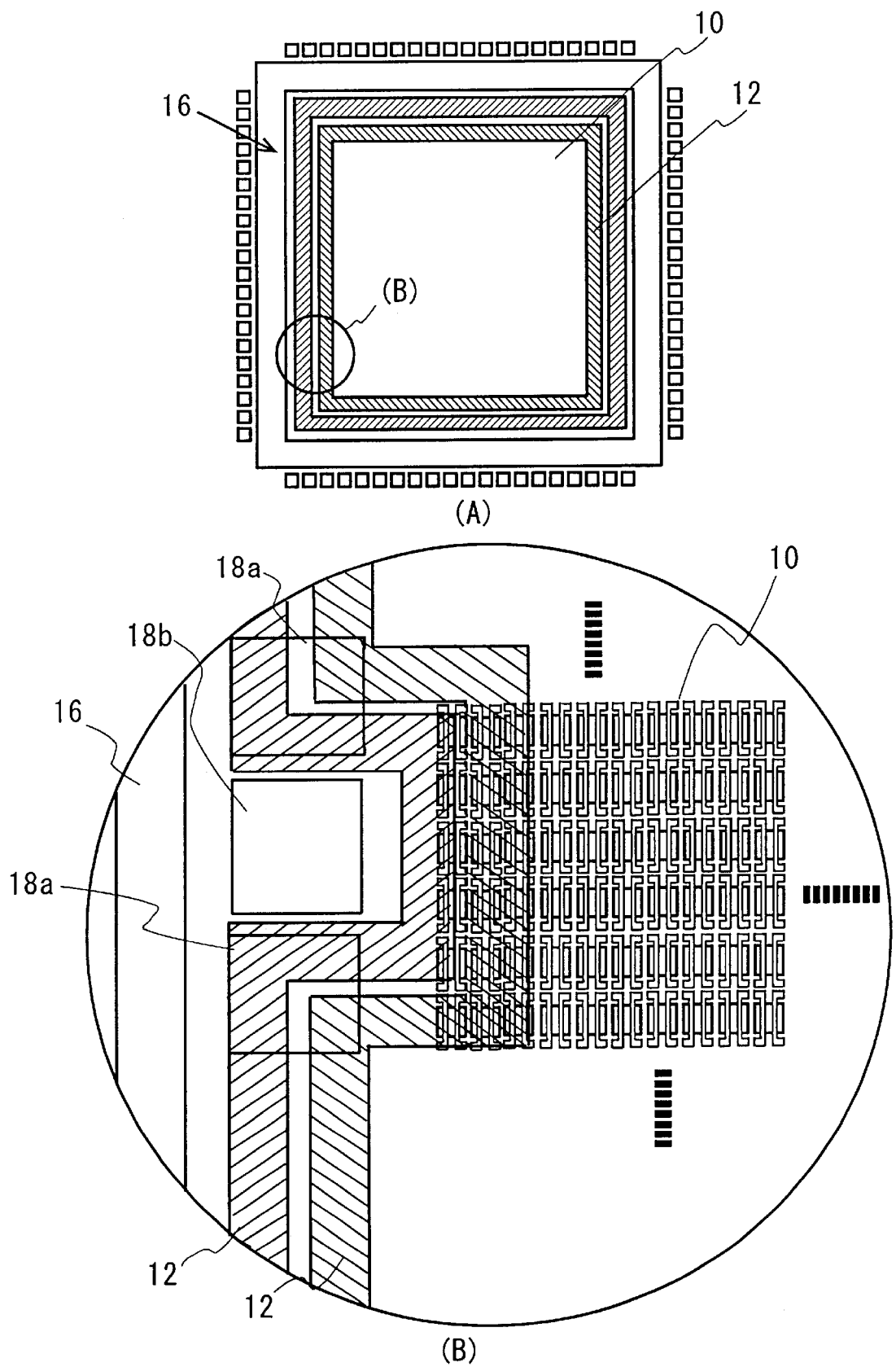
FIG. 10(a) shows a top view of another gate array according to the present invention.
FIG. 10(b) shows an enlarged view of the portion (B) in t FIG. 10(a).

FIG. 10(a) shows a top view of another gate array according to the present invention. FIG. 10(b) shows an enlarged view of the portion (B) in the FIG. 10(a). The gate array has a core cell region 10, a power supply pattern 12, an input/output cell region 16, and a plurality of capacity cells 18a and 18b. The capacity cell 18b is provided between the input/output cell region 16 and power supply pattern 12. The capacity cells 18a are provided under the power supply pattern 12. The capacity cell 18b is connected to the core cell region 10 to provide capacitance to core cell region 10. The capacity cells 18a can be used when large capacitance is needed. The capacity cells 18a and 18b have substantially equal capacitance, as do the plurality of capacity cells 18a. Because there are a plurality of capacity cells 18a and 18b, the desired capacitance can be easily provided to the core cell region 10 by connecting appropriate capacity cells 18a and 18b to the core cell region 10.

A section of the left side of the power supply pattern 12 is placed over the core cell region 10. The capacity cell 18b is provided between the input/output cell region 16 and power supply pattern 12. Because the capacity cells 18b are not provided under the power supply pattern 12, the influence caused by the change of the electrical potential of the power supply pattern 12 on the capacity cell 18b is reduced. Furthermore, because only a minimum portion of the power supply pattern 12 is provided over the core cell region 10, the area of the core cell region 10 which is not covered by the power supply pattern 12 can be used without interference with the power supply pattern 12.

Figure 11:
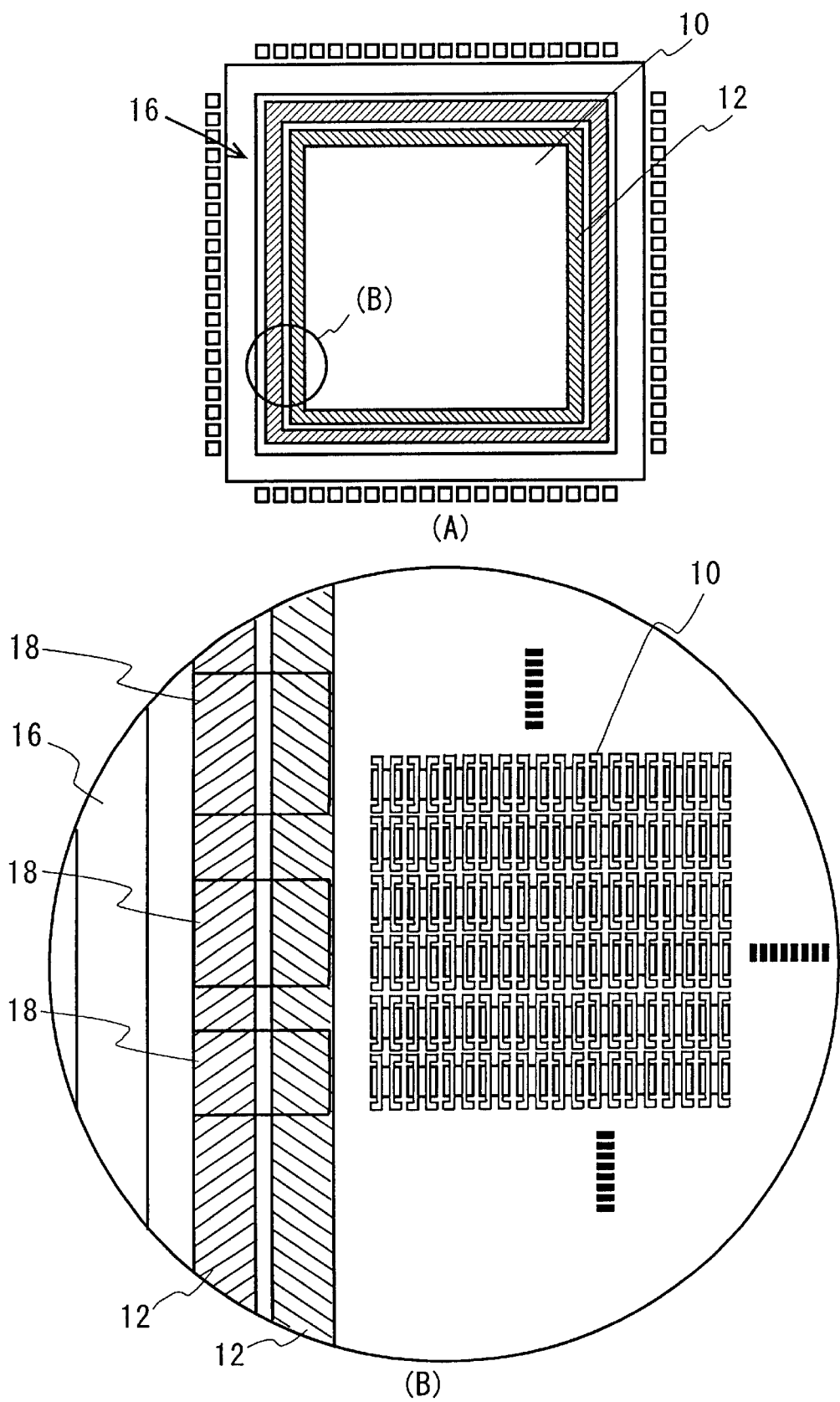
FIG. 11(a) shows a top view of another gate array of the present invention.
FIG. 11(b) shows an enlarged view of the portion (B) in the FIG. 11(a).

FIG. 11(a) shows a top view of another gate array according to the present invention. FIG. 11(b) shows an enlarged view of the portion (B) in the FIG. 11(a). The gate array has a core cell region 10, a power supply pattern 12, an input/output cell region 16, and a plurality of capacity cells 18. The capacity cells 18 are provided under the power supply pattern 12. The capacity cells 18 have different capacitance. Therefore, the amount of capacitance can be finely adjusted by connecting the desired capacity cell 18 to the core cell region 10 to easily obtain a desired capacitance.

Figure 12:
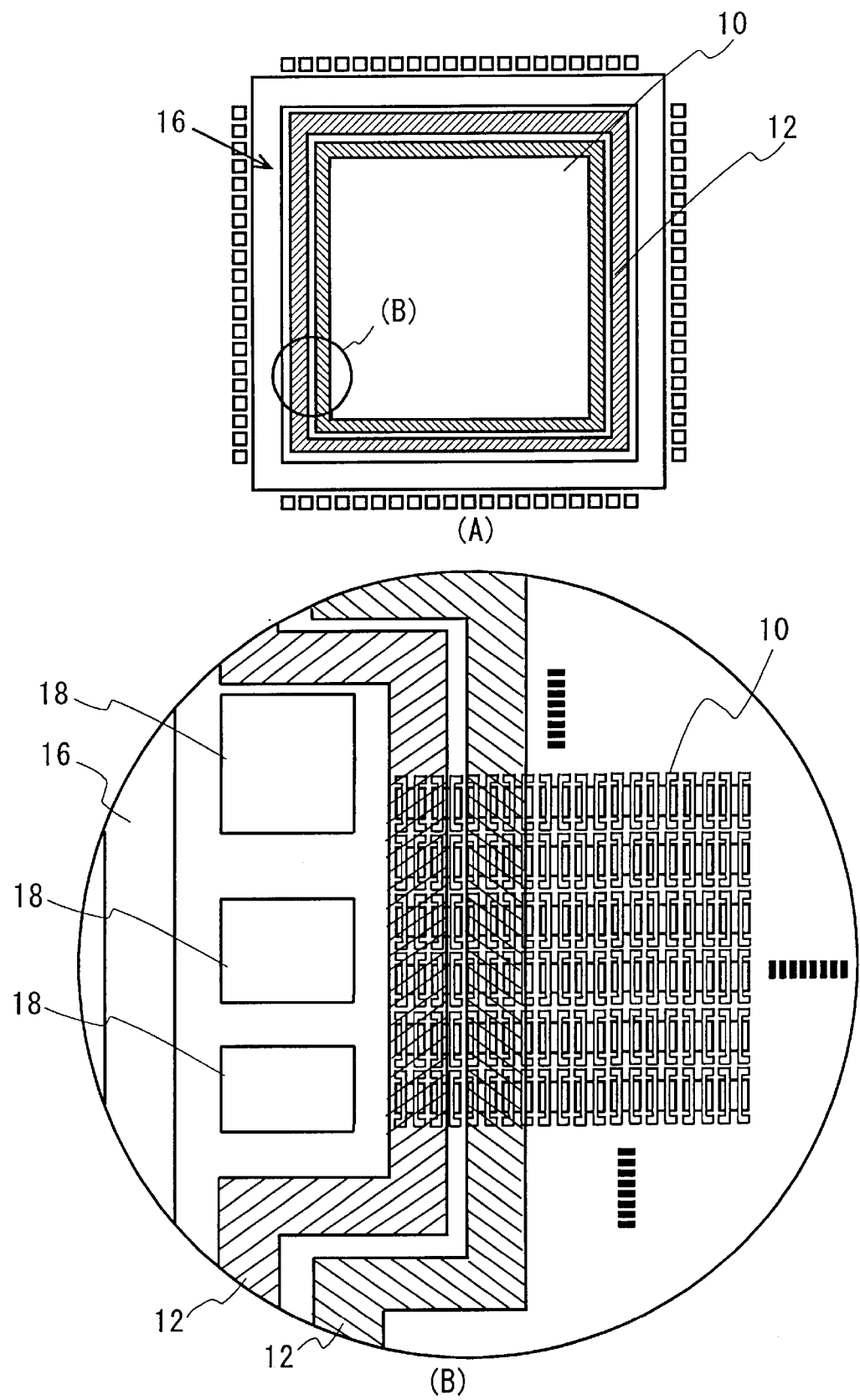
FIG. 12(a) shows a top view of another gate array of the present invention.
FIG. 12(b) shows an enlarged view of the portion (B) in the FIG. 12(a).

FIG. 12(a) shows a top view of another gate array according to the present invention. FIG. 12(b) shows an enlarged view of the portion (B) of FIG. 12(a). The gate array has a core cell region 10, a power supply pattern 12, an input/output cell region 16, and a plurality of capacity cells 18. The capacity cells 18, each having a different capacity, are provided between the input/output cell region 16 and the power supply pattern 12. Therefore, the capacitance can be finely adjusted by connecting the desired capacity cell 18 to the core cell region 10 to obtain a desired capacitance.

A portion of the left side of the power supply pattern 12 is provided over the core cell region 10. The capacity cells 18 are provided between the input/output cell region 16 and the power supply pattern 12. A part of the core cell region 10 is provided under the power supply pattern 12. Because the capacity cells 18 are not provided under the power supply pattern 12, the influence caused by the change of the electrical potential of the power supply pattern 12 on the capacity cells 18 is reduced. Furthermore, because only a minimum part of the power supply pattern 12 is provided over the core cell region 10, the area of the core cell region 10, which is not covered by the power supply pattern 12, can be used without interference with the power supply pattern 12.

Figure 13:
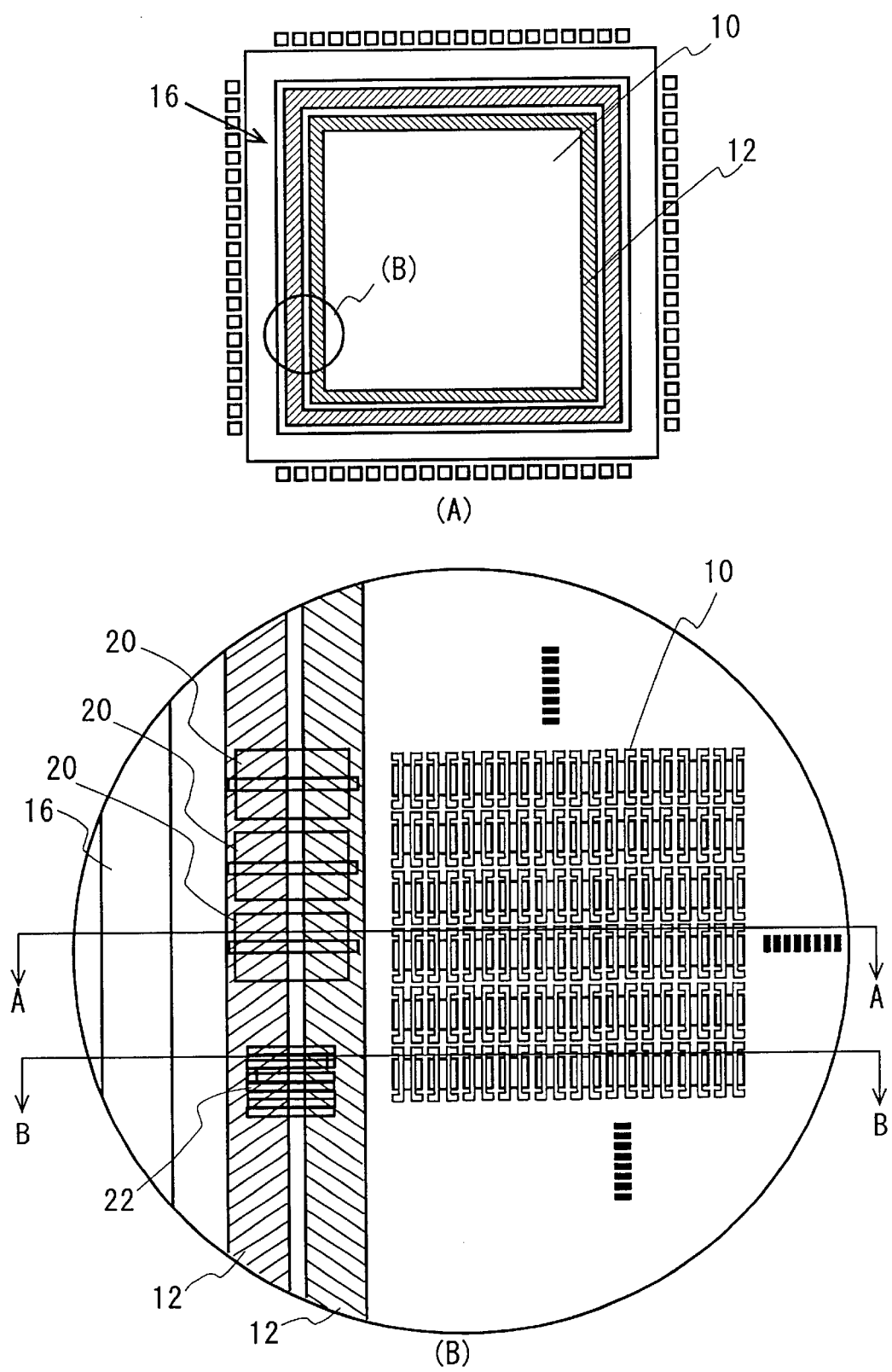
FIG. 13(a) shows a top view of another gate array of the present invent on, and FIG. 13(b) shows an enlarged view of the portion (B) in t FIG. 13(a).

FIG. 13(a) shows a top view of another gate array according to the present invention. FIG. 13(b) shows an enlarged view of the portion (B) in the FIG. 13(a). The gate array has a core cell region 10, a power supply pattern 12, an input/output cell region 16, a plurality of resistor cells 20, and a plurality of materials 22. The resistor cell 20 has a transistor that provides resistance to the core cell region 10. The material 22 can be made of a material having resistance such as silicide. The resistance of the material 22 is provided to the core cell region 10. The resistor cells 20 and materials 22 are provided beside the power supply pattern 12, for example, under the power supply pattern 12.

Figure 14:
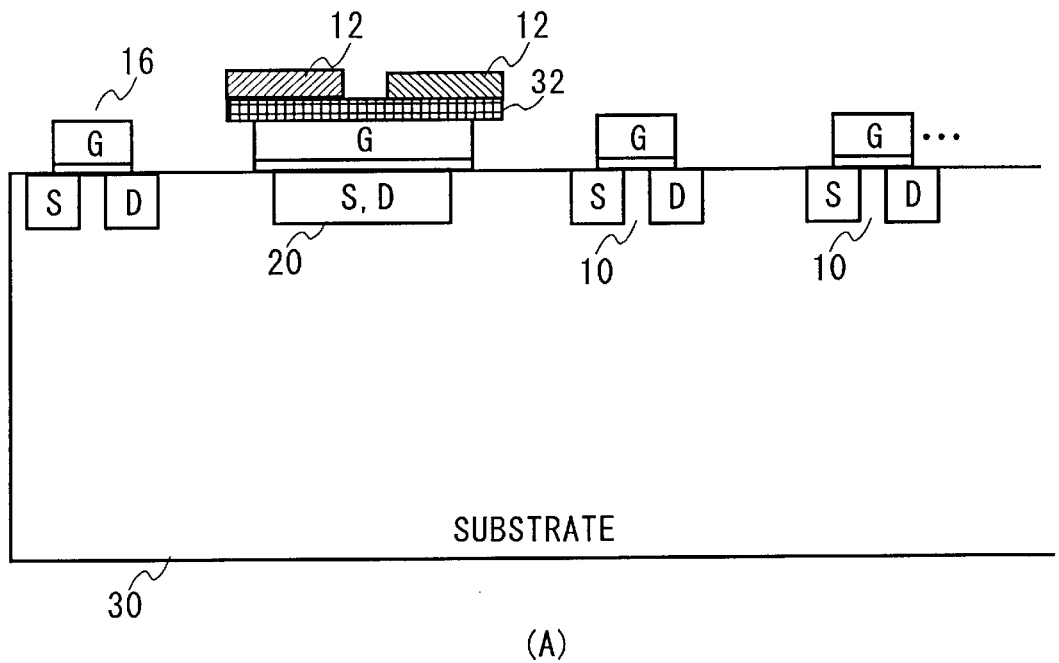
FIG. 14(a) shows an A—A cross sectional view of the gate array shown in FIG. 13(b)
FIG. 14(b) shows a B—B cross sectional view of the gate array shown in FIG. 13(b).
Figure 14:
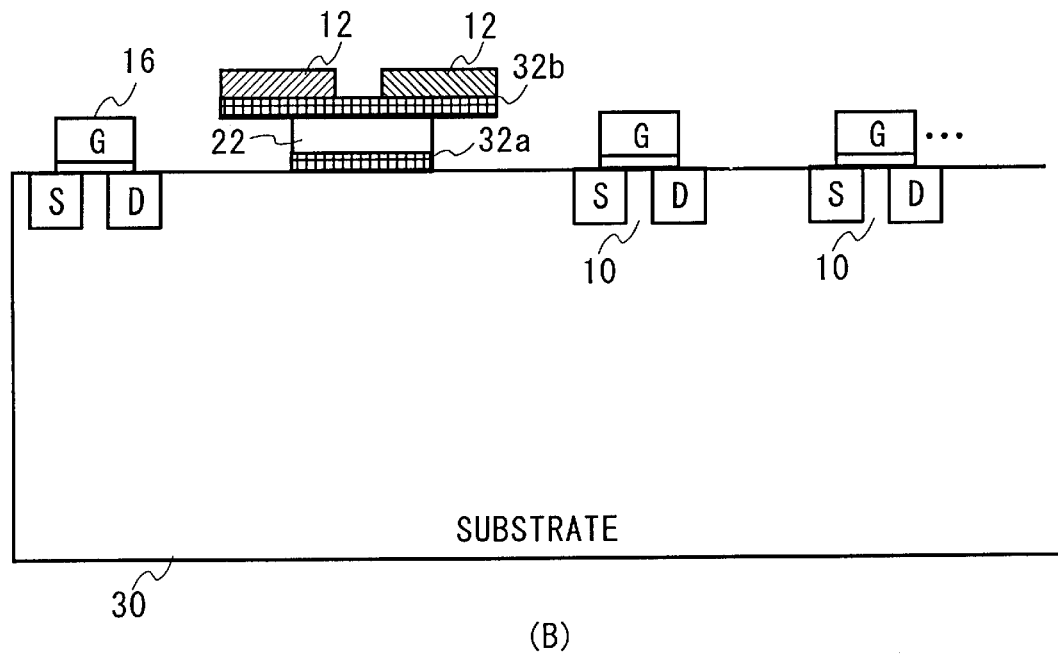

FIG. 14(a) shows an A—A cross sectional view of the gate array shown in FIG. 13(b). The resistor cell 20 is provided on the substrate 30. The power supply pattern 12 is provided on the insulator 32, which is provided on the resistor cell 20 to insulate the electric current between the power supply pattern 12 and the resistor cell 20. Therefore, the resistor cell 20 is between the substrate 30 and the power supply pattern 12.

FIG. 14(b) shows a B—B cross sectional view of the gate array shown in FIG. 13(b). The material 22 is provided on the insulator 32a, which is provided on the substrate 30 to insulate the electric current between the material 22 and the substrate 30. The power supply pattern 12 is provided on the insulator 32b, which is in turn provided on the material 22 to insulate the electric current between the power supply pattern 12 and the material 22. Therefore, the material 22 is between the substrate 30 and the power supply pattern 12.

To construct certain circuits, such as an analog circuit, within the gate array, a large resistance is required. Because the structure of the transistor of the resistor cell 20 is more flexible than the structure of the transistor of the core cell region 10, the resistance of the resistor cell 20 can be larger than the resistance of the core cell region 10.

The resistor cell 20 can be connected to the core cell region 10 for providing large resistance to the core cell region 10. A circuit, such as analog circuit, can thus be constructed within the gate array so that the number of signal pins of the gate array and the number of components outside the gate array can be reduced.

The plurality of resistor cells 20 has substantially equal resistance, as do the plurality of materials 22. Because there are a plurality of resistor cells 20 and materials 22, a desired resistance can be easily provided to the core cell region 10 by connecting appropriate resistor cells 20 and materials 22 to the core cell region 10.

Figure 15:
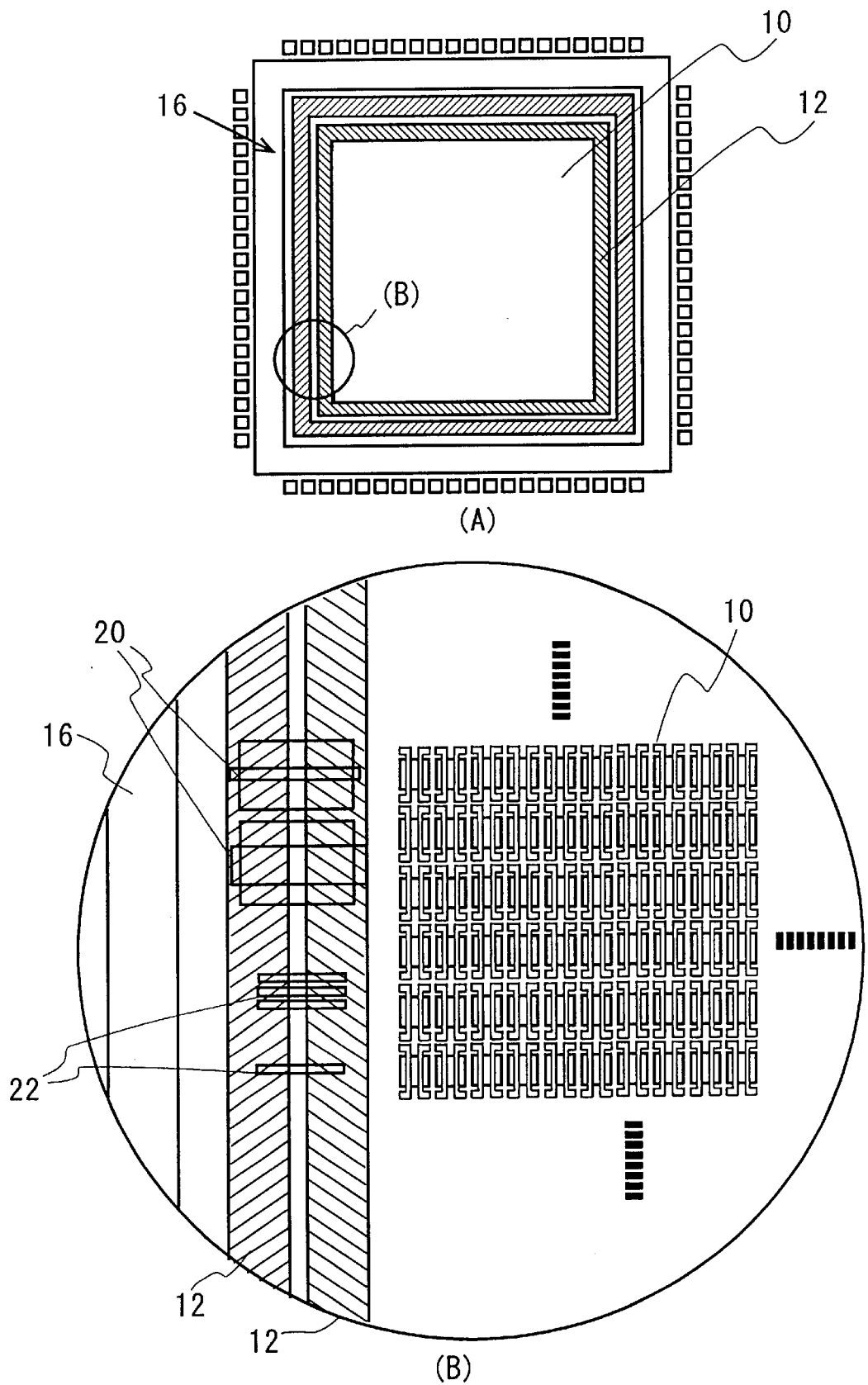
FIG. 15(a) shows a top view of another gate array of the present invention.
FIG. 15(b) shows an enlarged view of the portion (B) in the FIG. 15(a).

FIG. 15(a) shows a top view of another gate array according to the present invention. FIG. 15(b) shows an enlarged view of the portion (B) in the FIG. 15(a). The gate array has a core cell region 10, a power supply pattern 12, an input/output cell region 16, a plurality of resistor cells 20, and a plurality of materials 22. The resistor cells 20 and the materials 22 are provided under the power supply pattern 12, for example, between the substrate 30 and the power supply pattern 12.

The plurality of resistor cells 20 has different resistance, as do the plurality of materials 22. Therefore, the amount of resistance can be finely adjusted by connecting the desired resistor cell 20 and the desired material 22 to the core cell region 10 to obtain a desired resistance. An analog circuit can be placed within the gate array by connecting the resistor cells 20 and the materials 22 to the core cell region 10, so that the number of signal pins of the gate array and the number of components outside the gate array can be reduced.

Figure 16:
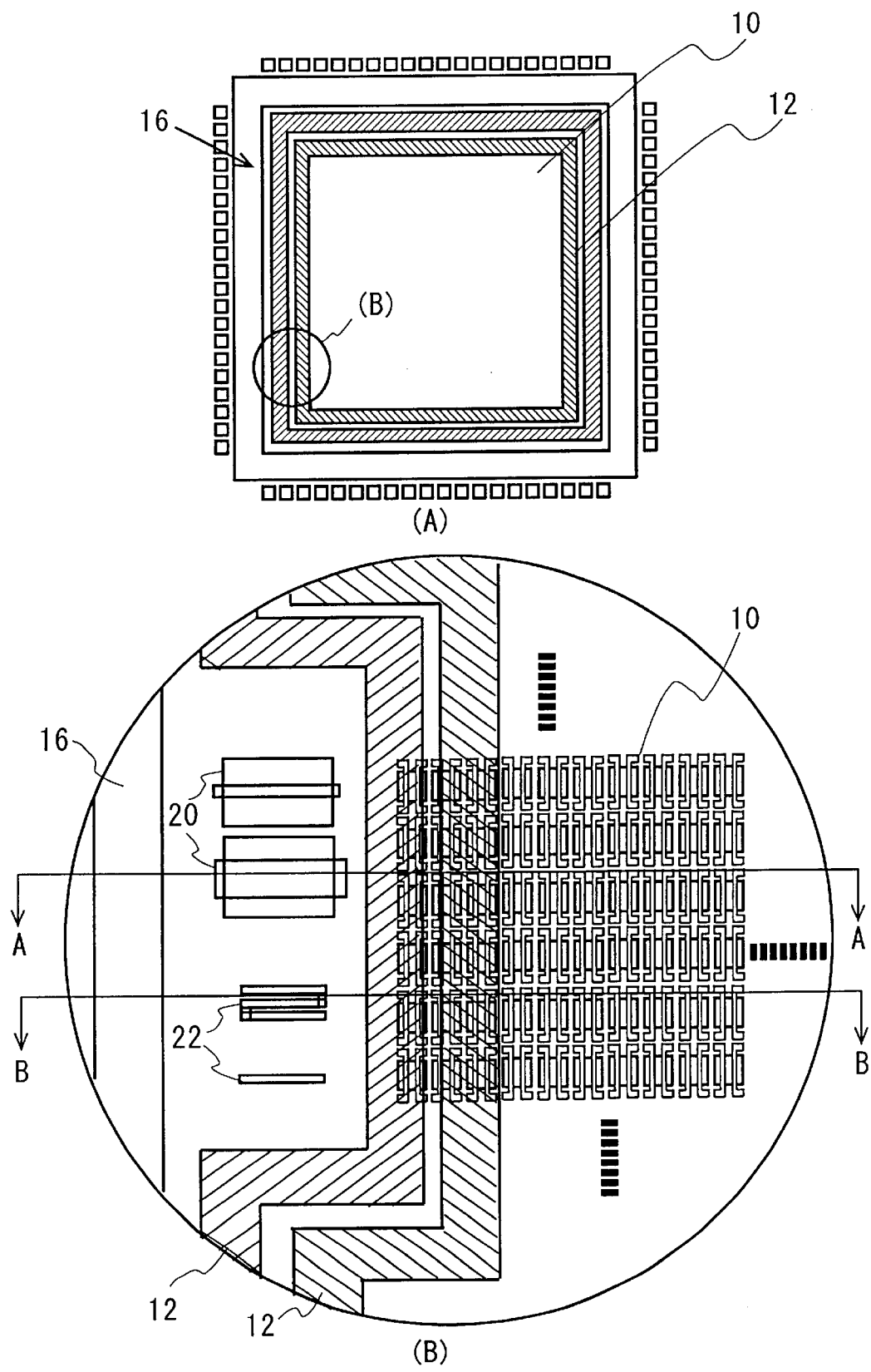
FIG. 16(a) shows a top view of another gate array of the present invention.
FIG. 16(b) shows an enlarged view of the portion (B) in the FIG. 16(a).

FIG. 16(a) shows a top view of another gate array according to the present invention. FIG. 16(b) shows an enlarged view of the portion (B) in the FIG. 16(a) The gate array has a core cell region 10, a power supply pattern 12, an input/output cell region 16, a plurality of resistor cells 20, and a plurality of materials 22. The resistor cells 20 are provided between the input/output cell region 16 and the power supply pattern 12.

A portion of the power supply pattern 12 is provided over the core cell region 10. The resistor cells 20 and the materials 22 are provided between the input/output cell region 16 and the power supply pattern 12. A potion of the core cell region 10 is provided under the power supply pattern 12.

Figure 17:
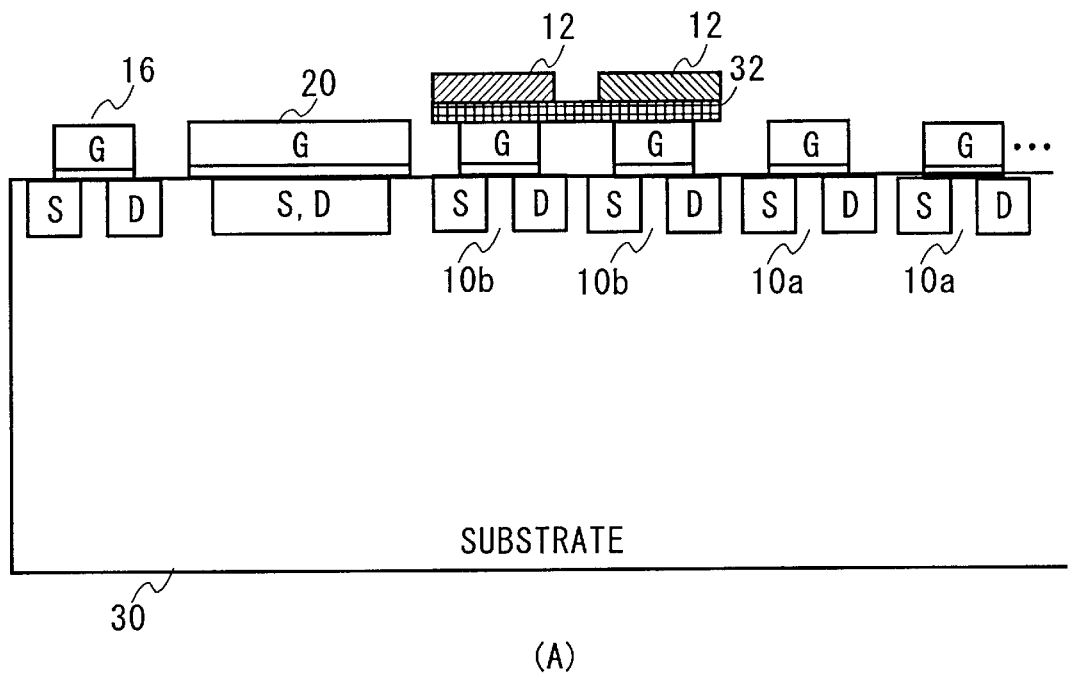
FIG. 17(a) shows an A—A cross sectional view of the gate array shown in FIG. 16(b)
FIG. 17(b) shows a B—B cross sectional view of the gate array shown in FIG. 16(b).
Figure 17:
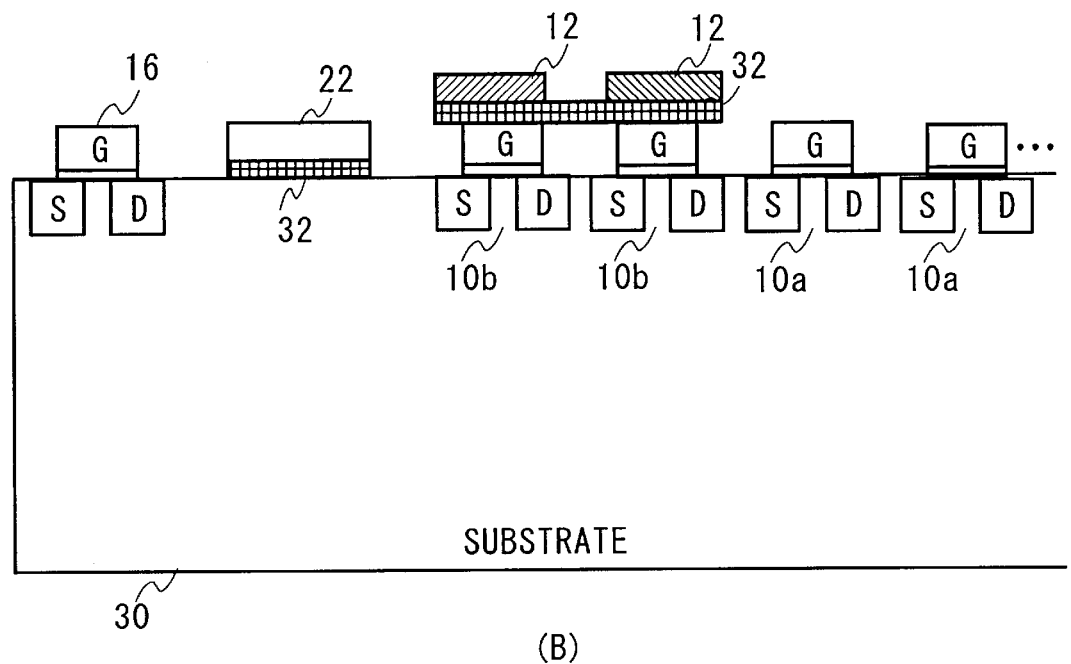

FIG. 17(a) shows an A—A cross sectional view of the gate array shown in FIG. 16(b). The core cell region 10b is provided between the power supply pattern 12 and the substrate 30. The resistor cell 20 is provided on the substrate 30. Because the power supply pattern 12 is provided over the core cell region 10b, the influence of the change of the electrical potential of the power supply pattern 12 on the resistor cell 20 can be reduced.

The capacity cell 18 has a capacitance that is larger than the capacitance of the core cell region 10, and the resistor cell 20 has a resistance that is larger than the resistance of the core cell region 10. The capacity cell 18, the resistor cell 20 and the material 22 can be connected to the core cell region 10 to provide large capacitance and resistance to the core cell region 10. Circuits such as phase-lock loop and analog circuits can thus be constructed within the gate array and the number of signal pins of the gate array and the number of components outside the gate array can be reduced.

Furthermore, because only a minimum area of the power supply pattern 12 is provided over the core cell region 10, the area of the core cell region 10 which is not covered by the power supply pattern 12 can be used without interference with the power supply pattern 12. The plurality of resistor cells 20 has different resistance, as do the plurality of materials 22. Therefore, the resistance can be finely adjusted by connecting the desired resistor cell 20and the desired material 22 to the core cell region 10 to obtain a desired resistance.

Figure 18:
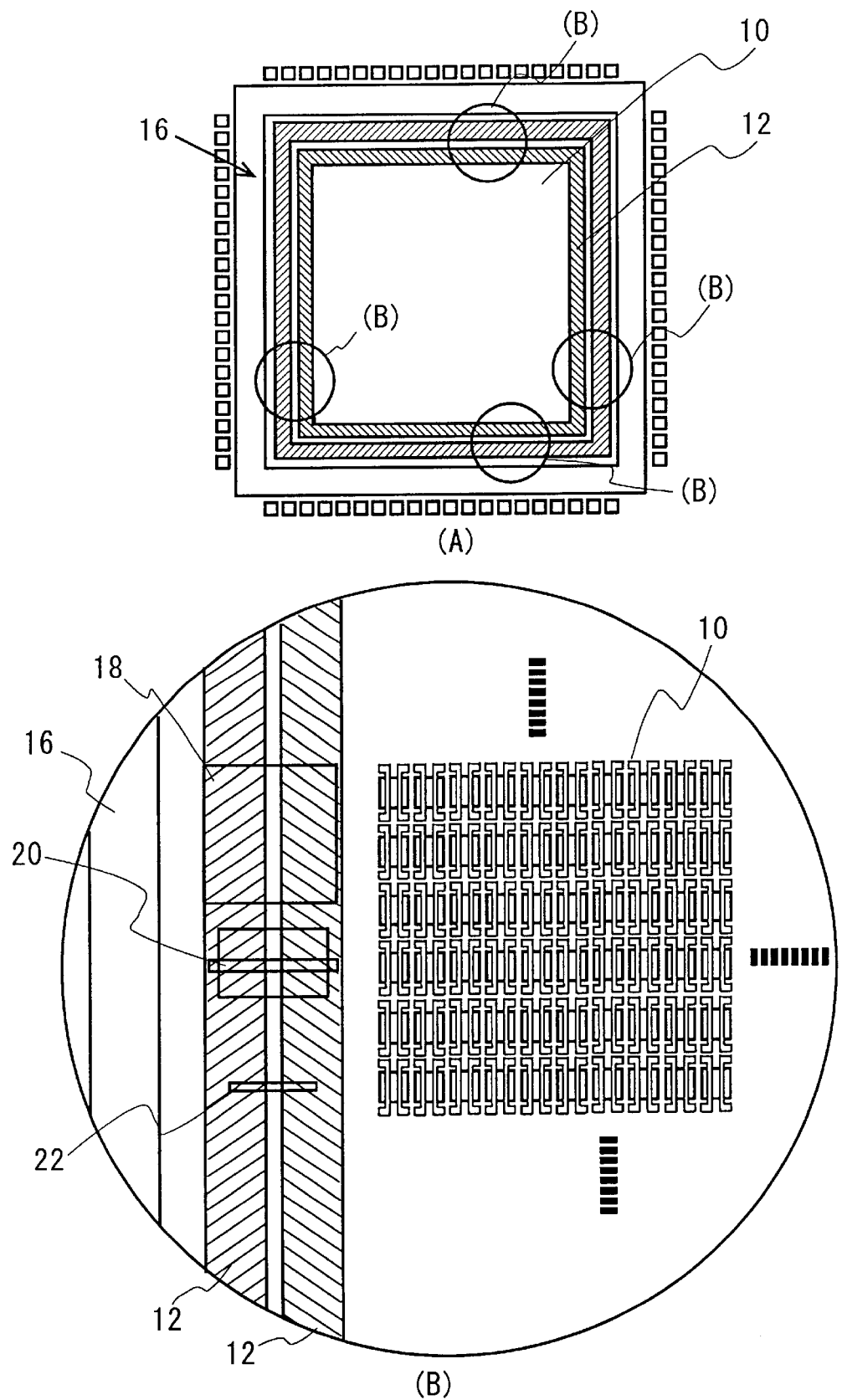
FIG. 18(a) shows a top view of another gate array of the present invention.
FIG. 18(b) shows an enlarged view of the portion (B) in the FIG. 18(a).

FIG. 18 shows a top view of another gate array according to the present invention. FIG. 18(b) shows an enlarged view of the portion (B) in the FIG. 18(a). The gate array has a core cell region 10, a power supply pattern 12, an input/output cell region 16, a plurality of the capacity cell 18, a plurality of resistor cells 20, and a plurality of materials 22. The capacity cells 18, the resistor cells 20, and the materials 22 are provided under the multiple sections of the power supply pattern 12.

The capacity cell 18, the resistor cell 20 and the material 22 can be connected to the core cell region 10 to provide large capacitance and resistance to the core cell region 10. Circuits such as phase-lock loop and analog circuits can thus be constructed within the gate array so that the number of signal pins of the gate array and the number of components outside the gate array can be reduced.

Figure 19:
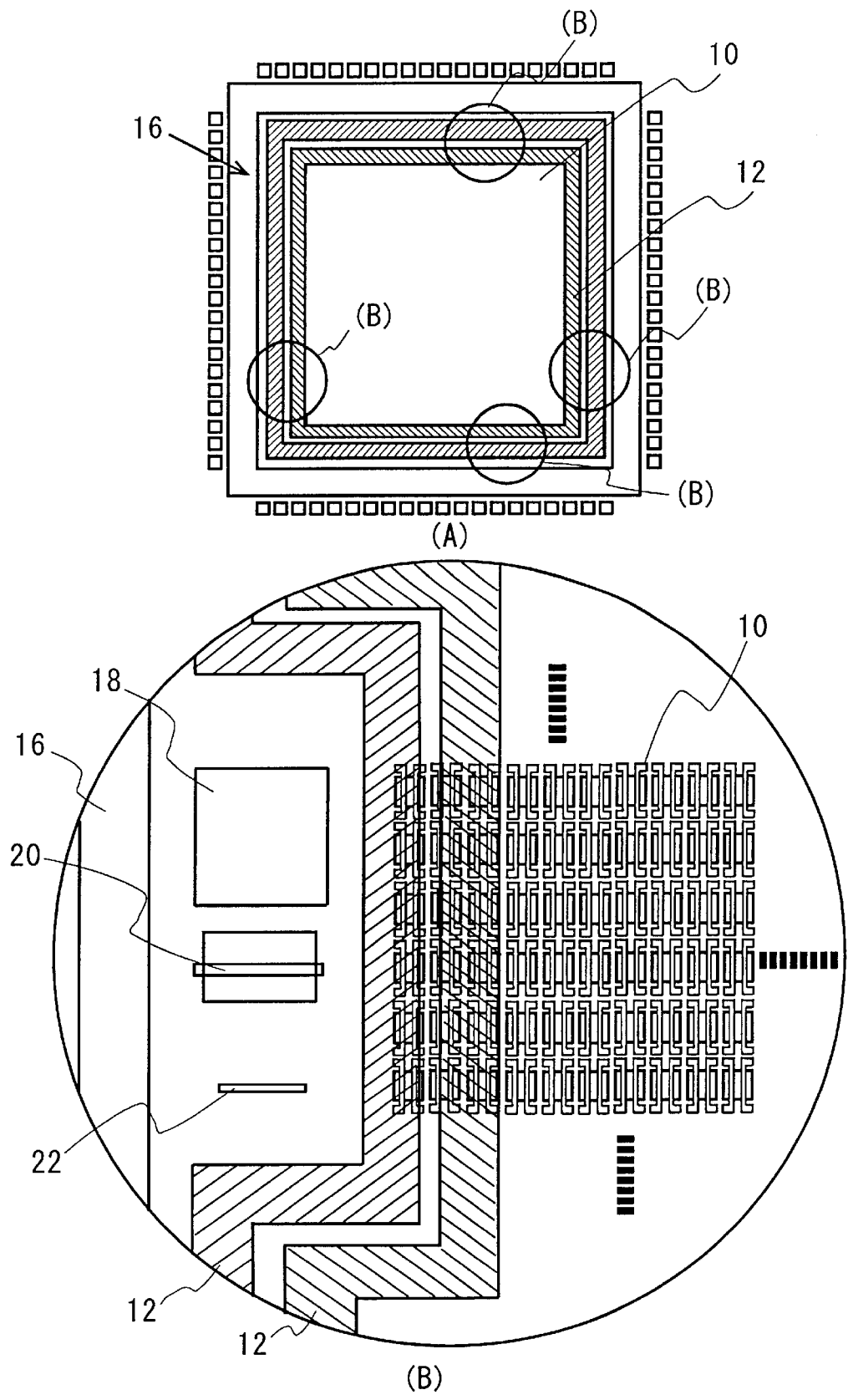
FIG. 19(a) shows a top view of yet another gate array of the present invention.
FIG. 19(b) shows an enlarged view of the portion (B) in the FIG. 19(a).

FIG. 19(a) shows a top view of another gate array according to the present invention. FIG. 19(b) shows an enlarged view of the portion (B) in the FIG. 19(a). The gate array has a core cell region 10, a power supply pattern 12, an input/output cell region 16, a plurality of capacity cells 18, a plurality of the resistor cells 20, and a plurality of the materials 22. The capacity cells 18, the resistor cells 20, and the materials 22 are provided between the power supply pattern 12 and the input/output cell region 16. Multiple sections of the power supply pattern 12 are provided over the core cell region 10.

Because the capacity cells 18, the resistor cells 20, and the materials 22 are not provided under the power supply pattern 12, the influence caused by the change of the electrical potential of the power supply pattern 12 on the capacity cells 18, the resistor cell 20, and the material 22 can be reduced. Furthermore, because only minimum portions of the power supply pattern 12 are provided over the core cell region 10, the area of the core cell region 10, which is not covered by the power supply pattern 12, can be used without interfering with the power supply pattern 12. Circuits such as phase-lock loop and analog circuits can thus be constructed within the gate array by connecting the desired capacity cells 18, the desired resistor cells 20, and the desired materials 22 to the core cell region 10. The number of signal pins of the gate array and the number of components outside the gate array can thereby be reduced.

Although the present invention has been described by reference to specific embodiments, the scope of the present invention is not limited to these embodiments. Those skilled in the art can make various modifications and improvements to these embodiments of the present invention. It is clear from the appended claims that such modifications or improvements are also covered by the scope of the present invention.

What is claimed is:

1. A gate array comprising:
    a core cell having a plurality of logic gates;
    a power supply pattern provided beside said core cell; and
    a border element provided beside said power supply pattern, said border element comprising at least one of,
    a capacity cell including a transistor for providing capacitance to said core cell, the capacitance of said capacity cell being larger than a capacitance of said core cell, and
    a resistor cell including a transistor for providing resistance to said core cell.

2. A gate array as claimed in claim 1, wherein said border element has a capacity cell including a transistor for providing said capacitance to said core cell.

3. A gate array as claimed in claim 2, wherein said capacity cell is provided under said power supply pattern.

4. A gate array as claimed in claim 3, wherein said border element has a plurality of said capacity cells; and said capacitance of each of said capacity cells is substantially equal.

5. A gate array as claimed in claim 3, wherein said border element has a plurality of said capacity cells; and each of said capacity cells has a different capacitance.

6. A gate array as claimed in claim 2 further comprising:

an input/output cell region provided beside said power supply pattern to input and output data for said core cell; and said capacity cell is provided between said power supply pattern and said input/output cell region.

7. A gate array as claimed in claim 6, wherein a portion of said core cell is provided under said power supply pattern.

8. A gate array as claimed in claim 6, wherein said border element has a plurality of said capacity cells; and said capacitance of each of said capacity cells is substantially equal.

9. A gate array as claimed in claim 6, wherein said border element has a plurality of said capacity cells; and each of said capacity cells has a different capacitance.

10. A gate array as claimed in claim 7, wherein said border element has a plurality of said capacity cells; and said capacitance of each of said capacity cells is substantially equal.

11. A gate array as claimed in claim 7, wherein said border element has a plurality of said capacity cells; and each of said capacity cells has a different capacitance.

12. A gate array as claimed in claim 2, wherein said capacitance of said capacity cell is larger than capacitance of said core cell.

13. A gate array as claimed in claim 2, wherein a width of said capacity cell is substantially equal to a width of said power supply pattern.

14. A gate array as claimed in claim 1, wherein said border element has a resistor cell including a transistor for providing said resistance to said core cell.

15. A gate array as claimed in claim 14, wherein said resistance of said resistor cell is larger than resistance of said core cell.

16. A gate array as claimed in claim 14, wherein said resistor cell is provided under said power supply pattern.

17. A gate array as claimed in claim 16, wherein said border element has a plurality of said-resistor cells; and said resistance of each of said resistor cells is substantially equal.

18. A gate array as claimed in claim 16, wherein said border element has a plurality of said resistor cells; and each of said resistor cells has a different resistance.

19. A gate array as claimed in claim 14 further comprising:

an input/output cell region provided beside said power supply pattern to input and output data for said core cell; and said resistor cell is provided between said power supply pattern and said input/output cell region.

20. A gate array as claimed in claim 19, wherein a portion of said core cell is provided under said power supply pattern.

21. A gate array as claimed in claim 20, wherein said border element has a plurality of said resistor cells; and said resistance of each of said resistor cells is substantially equal.

22. A gate array as claimed in claim 20, wherein said border element has a plurality of said resistor cells; and each of said resistor cells has a different resistance.

23. A gate array as claimed in claim 19, wherein said border element has a plurality of said resistor cells; and said resistance of each of said resistor cells is substantially equal.

24. A gate array as claimed in claims 19, wherein said border element has a plurality of said resistor cells; and each of said resistor cells has a different resistance.

25. A gate array as claimed in claim 1, wherein said border element has a capacity cell including a transistor for providing capacitance to said core cell, a resistor cell including a transistor for providing resistance to said core cell, and a material having resistance to be provided to said core cell.

26. A gate array as claimed in claim 1, wherein said border element has a material having said resistance to be provided to said core cell.

27. A gate array as claimed in claim 26, wherein said material is provided under said power supply pattern.

28. A gate array as claimed in claim 27, wherein said border element has a plurality of said materials; and each of said materials has substantially equal resistance.

29. A gate array as claimed in claim 27, wherein said border element has a plurality of said materials; and each of said materials has a different resistance.

30. A gate array as claimed in claim 26, wherein said material is provided between said power supply pattern and said input/output cell region.

31. A gate array as claimed in claim 30, wherein said border element has a plurality of said materials; and each of said materials has a different resistance.

32. A gate array as claimed in claim 30, wherein a portion of said core cell is provided under said power supply pattern.

33. A gate array as claimed in claim 32, wherein said border element has a plurality of said materials; and each of said materials has substantially equal resistance.

34. A gate array as claimed in claim 32, wherein said border element has a plurality of said materials; and each of said materials has a different resistance.

35. A gate array as claimed in claim 30, wherein said border element has a plurality of said materials; and each of said materials has substantially equal resistance.

36. A gate array as claimed in claim 35, wherein said border element has a resistor cell, and wherein said capacity cell, said resistor cell, and at least one of the plurality of said materials are provided under said power supply pattern.

37. The gate array of claim 36, wherein said capacity cell, said resistor cell and said plurality of said materials are spaced apart from one another, and each of which connects to said core cell.

* * * * *